(12) United States Patent
Multrus

(10) Patent No.: US 7,984,689 B2
(45) Date of Patent: Jul. 26, 2011

(54) DEVICE FOR THE CONTINUOUS COATING OF A STRIP-LIKE SUBSTRATE

(75) Inventor: Erwin Multrus, Glattbach (DE)

(73) Assignee: Applied Materials, Inc., Santa Clara, CA (US)

(*) Notice: Subject to any disclaimer, the term of this patent is extended or adjusted under 35 U.S.C. 154(b) by 429 days.

(21) Appl. No.: 12/034,031

(22) Filed: Feb. 20, 2008

(65) Prior Publication Data

US 2008/0245295 A1 Oct. 9, 2008

Related U.S. Application Data

(60) Provisional application No. 60/909,773, filed on Apr. 3, 2007.

(30) Foreign Application Priority Data

Apr. 3, 2007 (EP) .................................. 07006980

(51) Int. Cl.
*B05C 1/14* (2006.01)

(52) U.S. Cl. ...... 118/50; 118/249; 118/256; 204/298.24; 204/298.25; 101/216; 101/218; 101/247; 101/375

(58) Field of Classification Search .............. 118/46, 118/249, 256, 718, 720, 50; 101/216, 218, 101/247, 375; 204/298.24, 298.25; 427/294

See application file for complete search history.

(56) References Cited

U.S. PATENT DOCUMENTS

| 4,832,983 A | 5/1989 | Nagatomi et al. | |
| 5,223,038 A | 6/1993 | Kleyer | |
| 5,350,598 A | 9/1994 | Kleyer | |
| 5,570,633 A * | 11/1996 | Schultz et al. | 101/182 |
| 6,085,650 A * | 7/2000 | Petersen | 101/220 |
| 2003/0209160 A1* | 11/2003 | Gilbert | 101/483 |
| 2006/0162592 A1* | 7/2006 | Oberholzer | 101/153 |

FOREIGN PATENT DOCUMENTS

| DE | 4100643 C1 | 10/1991 |
| DE | 43 10 089 A1 | 9/1994 |
| DE | 4310085 A1 | 9/1994 |
| DE | 19732929 A1 | 2/1999 |
| EP | 0 447 550 A1 | 9/1991 |

* cited by examiner

*Primary Examiner* — Laura Edwards
(74) *Attorney, Agent, or Firm* — Patterson & Sheridan, LLP

(57) ABSTRACT

The invention relates to a device for the continuous coating of a strip-like substrate in a vacuum, especially for producing coating patterns on the substrate, with a printing roller and a backing roller, the substrate guided between the printing roller and the backing roller. The invention device includes a coating or release agent transferable to the substrate via the printing roller and a servo unit that has a controllable servo motor, wherein in a working position adjustable with the servo unit, the printing roller and the backing roller are in operative connection with one another. The object of the invention is to improve the abadjustability of the generic device. The object is achieved by the servo unit's having a controllable servo motor.

12 Claims, 4 Drawing Sheets

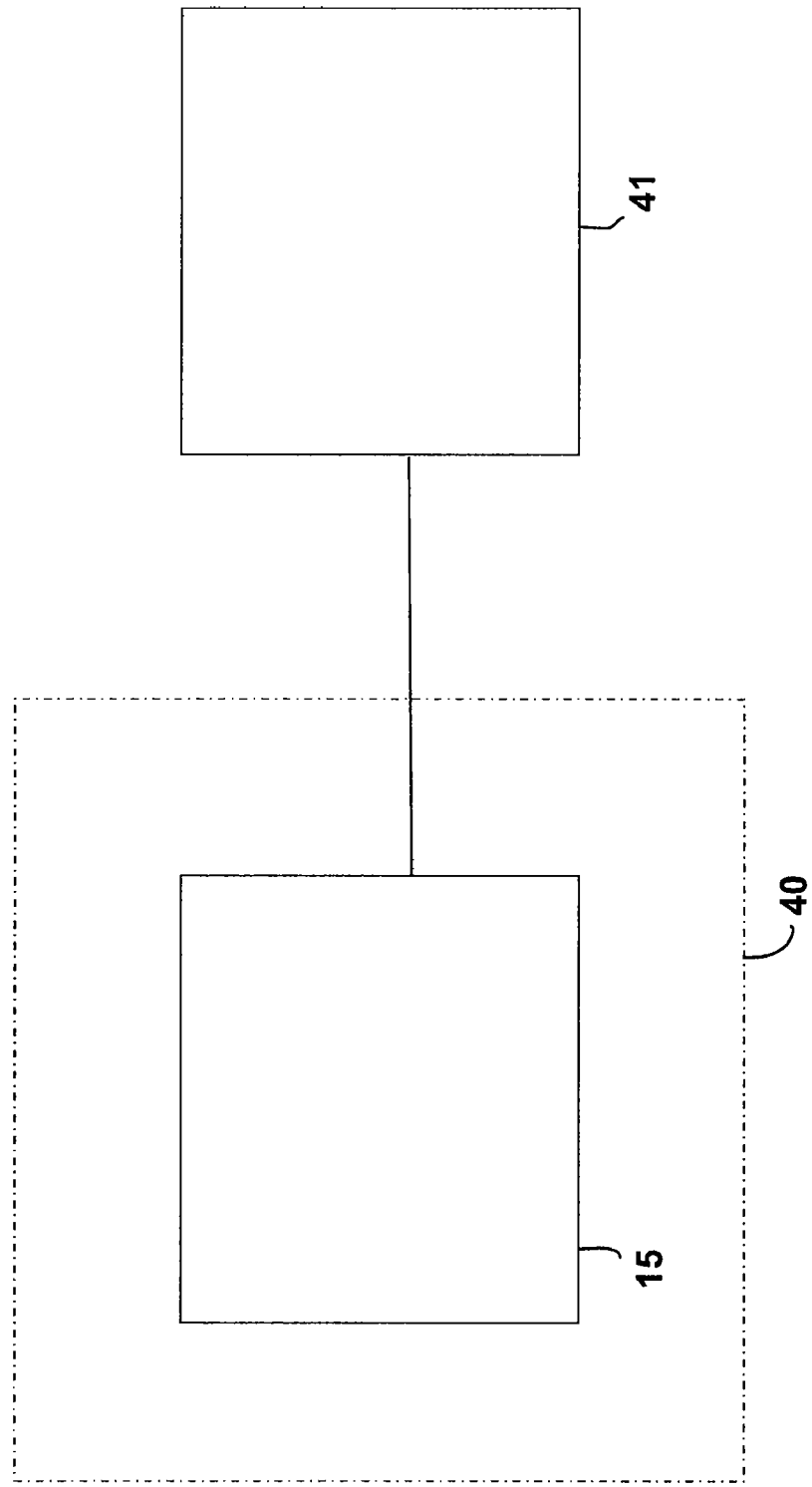

DEVICE FOR THE CONTINUOUS COATING OF A STRIP-LIKE SUBSTRATE

CROSS-REFERENCE TO RELATED APPLICATIONS

This application claims priority to U.S. Provisional Patent Application Ser. No. 60/909,773, filed Apr. 3, 2007, entitled "Device for the Continuous Coating of a Strip-Like Substrate," which is incorporated herein in its entirety by reference.

BACKGROUND OF THE INVENTION

1. Field of the Invention

Embodiments of the invention generally relate to a device for continuous coating of a strip-like substrate in a vacuum, especially for manufacturing coating patterns on the substrate with a printing roller and a backing roller between which the substrate is transported.

2. Description of the Related Art

The invention furthermore relates to devices for continuous coating of a strip-like substrate in a vacuum wherein in a working position adjustable with a servo unit, the printing roller and the backing roller are in operative connection with one another by means of which a coating or release agent is transferable to the substrate via the printing roller.

Devices of this kind are used especially in coating installations for continuous evaporation or sputtering of foil strips and webs in a vacuum. In special embodiments, they serve for example in the production of coating patterns on the strip-like substrate that are formed either in longitudinal stripes or across the full coating width of the substrate to be coated. These coating patterns, also called pattern structures, have in some cases sections that are coating-free that can be realized by different coating masks. In pattern masking, a special oil-masking technique, when this technology is applied to coating technology, the coating-free sections are masked by means of a release agent, mostly oil, before the coating material is applied to the substrate. The prior art, as known from, e.g. DE 197 32 929 A1, DE 43 10 085 A1 and DE 41 00 643 C1, consists in feeding the strip-like substrate, e.g. a foil strip between a printing roller and a backing roller, with the printing roller having projecting pattern elements, which are wetted with an oil film, such that an oil pattern is applied to the strip-like substrate during roll-off of the printing roller. The oil-patterned strip is subsequently coated by sputtering or evaporation, whereby the, e.g., metallic coating material deposits on the oil-free sections of the substrate as a layer of metal and the masked areas are protected from the condensing metal, such that the result is selective metallization pattern on the substrate. Capacitor foils are made in this way, for example.

Setting of the printing roller and the backing roller relative to each other in a working position in which the release agent is transferred to the substrate occurs by means of a servo unit, which has a guideway for the printing roller or the backing roller, an adjustable stop of the guideway as well as one or more hydraulically or pneumatically actuated pressure cylinders for offsetting the rollers. When the pressure cylinders are actuated, for example, the printing roller is moved axially parallel with the backing roller toward the latter. Likewise, the backing roller can also be moved by means of the pressure cylinder toward the printing roller. The adjustable stop of the guideway limits the respective pressure cylinder stroke at an end position, which corresponds to the precise working position of the printing roller relative to the backing roller. The position of the stop is predetermined by a manual adjusting screw corresponding to the parameters of the respective pattern process. Thus, the rollers, under variable parameters, are aligned with each other with the greatest precision in the working position required in each case. The position selected for the stop is fixed with a clamping screw. Counter-pressure cylinders of the servo unit that are directed against the pressure cylinders move the printing roller from the working position into a resting position in which the printing roller and the backing roller are disconnected from each other in order that, for example, a sleeve of the printing roller may be exchanged for the projecting pattern elements. Exchangeable sleeves make it possible to produce strip-like substrates in all kinds of patterns. After a sleeve change, the working position has to be reset in order that correct alignment and the appropriate contact pressure of the printing roller against the backing roller may be ensured. To this end, the locator of the stop is released by hand and the pressure cylinder is actuated until the printing roller rests flush against the backing roller. Subsequently, the stop is adjusted by means of the adjusting screw in accordance with the executed pressure cylinder stroke and located in position with the clamping screw. The coating installation is then sealed vacuum-tight, evacuated and test coating is performed so that the dimensional accuracy of the coating pattern may be checked. The precision with which the working position of the rollers has been set by the servo unit can be judged only from the coated substrate. If necessary, the setting process must be repeated after venting of the coating installation, and more precisely until the coating pattern is of the desired quality. Precision setting of the working position of the printing roller against the backing roller after a change in parameters of the pattern process, such as after a sleeve change, therefore entails a high outlay on time, which can amount to more than one working day, depending upon the situation. In addition, this time- and labor-intensive setting-up causes substantial production downtimes, which impair the economics of the coating installation.

The object of the invention is therefore to overcome the disadvantages of the prior art and to improve the adjustability of the generic device. This object is achieved in accordance with embodiments described herein by the servo unit having a controllable servo motor for adjusting the working position.

SUMMARY OF THE INVENTION

The present invention generally relates to a device for continuous coating of a strip-like substrate in a vacuum, especially for manufacturing coating patterns on the substrate with a printing roller and a backing roller between which the substrate is transported. The invention furthermore relates to devices for continuous coating of a strip-like substrate in a vacuum wherein in a working position adjustable with a servo unit, the printing roller and the backing roller are in operative connection with one another by means of which a coating or release agent is transferable to the substrate via the printing roller.

In one aspect of the invention, the device for the continuous coating of a strip-like substrate in a vacuum includes a printing roller and a backing roller, where the substrate is guided between the printing roller and the backing roller. The device also includes a coating or release agent transferable to the substrate via the printing roller. Furthermore, the device includes a servo unit that has a controllable servo motor, wherein in a working position adjustable with the servo unit, the printing roller and the backing roller are in operative connection with one another.

BRIEF DESCRIPTION OF THE DRAWINGS

So that the manner in which the above-recited features of the present invention can be understood in detail, a more particular description of embodiments of the invention, briefly summarized above, may be had by reference to embodiments, some of which are illustrated in the appended drawing. It is to be noted, however, that the appended drawing illustrates only typical embodiments of this invention and are therefore not to be considered limiting of its scope, for the invention may admit to other equally effective embodiments.

FIG. 4 is a schematic illustration of servo motor within a vacuum coating installation.

DETAILED DESCRIPTION

Figure 1:
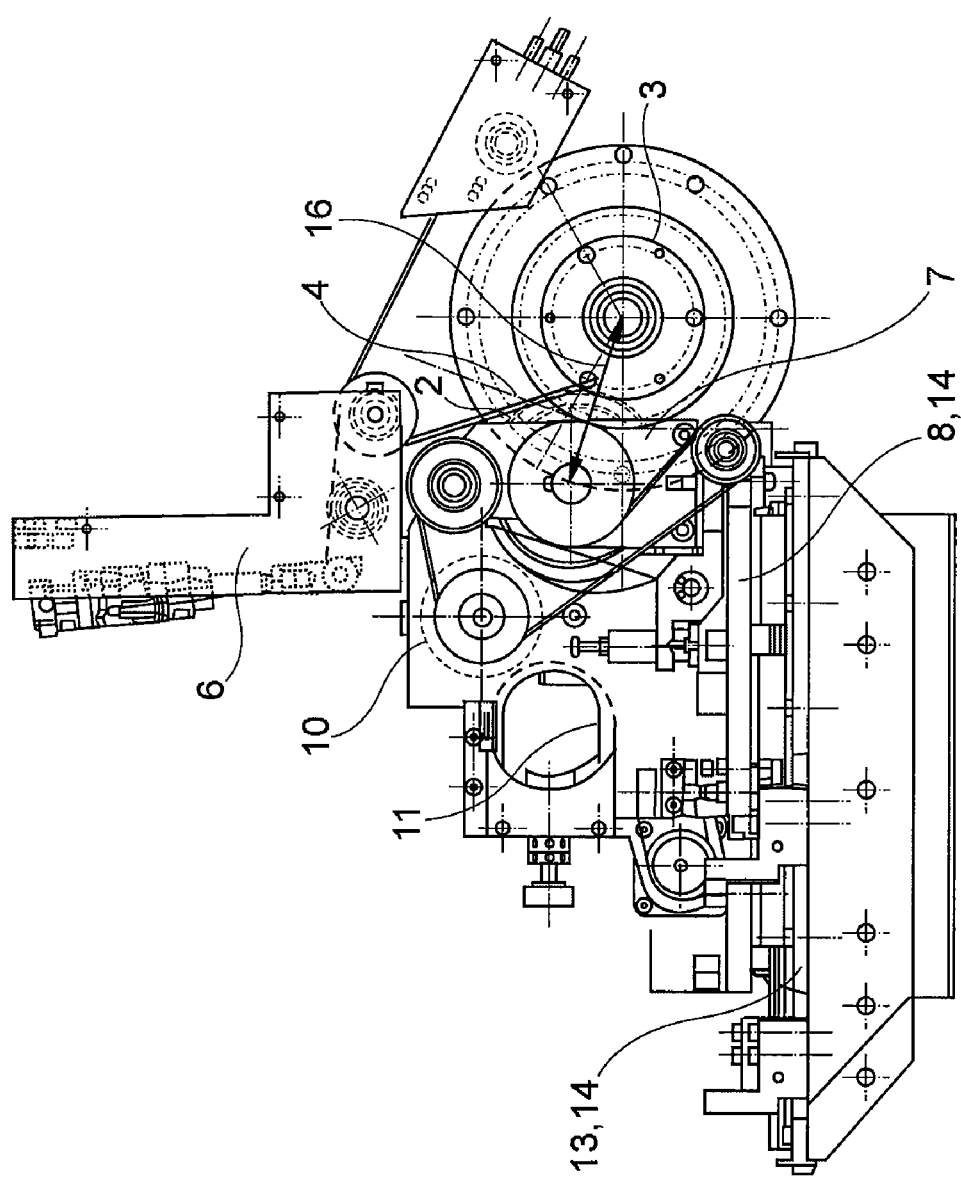
FIG. 1 is a side view of an inventive embodiment of the device, labeled pattern module, in a working position.

Embodiments of the invention generally relate to a device for continuous coating of a strip-like substrate in a vacuum, and, more specifically, to manufacturing coating patterns on the substrate with a printing roller and a backing roller. The substrate is guided between the printing roller and the backing roller. A coating or release agent is transferable to the substrate via the printing roller when the printing roller and backing roller are in operative connection with one another. The device also includes a servo unit that has a controllable servo motor, wherein in a working position adjustable with the servo unit, the printing roller and the backing roller are in operative connection with one another. The measures specified in the claims describe advantageous embodiments and arrangements of the invention.

Setting of the working position of the rollers acting in operative connection with one another does not have to be effected by manual adjustment on the servo unit itself. If, for example, the rotational position of the adjusting screw, which determines the position of the stop of the guideway of the rollers, is motor-controlled or if a controllable servo motor is used for the adjustment movement for the purpose of changing the gap between the printing roller and the backing roller, the working position can be set by controlling the servo motor(s) from the outside, i.e. outside the vacuum-tight coating installation. The result is that repeated evacuation and venting of the coating installation during the adjustment process are unnecessary, a fact which leads to enormous time savings. As a corollary, process downtimes are substantially shortened and the servo unit is easier to operate.

If the servo motor is used for the adjusting movement for setting a radial distance between the printing roller and the backing roller, it is possible, in addition to the printing roller for feeding the roller(s) into a working position, to eliminate the counter-pressure cylinder for returning the roller(s) into a resting position during a break in production, since the servo motor can equally effect the changing, counter-directional controlling movement of the printing or backing roller into the working position or into the resting position. This leads not only to minimization of servo unit design but, due to elimination of the hydraulic or compressed air connections to the pressure or counter-pressure cylinder, also to an elimination of associated line feedthroughs through the vacuum chamber wall of the coating installation, a fact which reduces the risk of leaks.

If a stepper motor is provided as servo motor, particularly precise graduated adjustment of the working position can take place. The stepper motor is a synchronous motor, which can be precisely rotated through a minimum angle (step) or an exact multiple of the angle by a controlled, stepped-rotating electromagnetic field. If a stepper motor is used especially for adjusting the radial distance between the printing roller and the backing roller, this distance can be altered in precise increments, and thus precise adjustment of the working position can be effected, such that a mechanical stop in the guideway of the rollers for precision adjustment can be dispensed with in the design. Since stepper motors precisely follow the applied external electromagnetic field because of their synchronous motor behavior, they can be directly controlled with high precision, without the need for an automatic control loop with sensors for position feedback.

Preferably, the printing roller can be connected to and disconnected from the backing roller by means of the servo unit. In this regard, the backing roller is permanently fixed in its axial position, with only the printing roller being adjustable, in order that the working position and the resting position may be realized. The function of the servo unit here is reduced to connection and disconnection of the printing roller, as a result of which the design effort for the servo unit is further minimized and at the same time the positioning accuracy is improved because of fewer error influences.

In a particularly advantageous embodiment, the servo unit has a guide carriage mounted on a guide rail, on which carriage the printing roller is arranged. Thus, linear guiding of the printing roller is possible, which being precisely aligned perpendicular to the axis of rotation of the backing roller, ensures axially parallel guiding of the printing roller relative to the axis of rotation of the backing roller in any position. This guide rail influences minimizes interfering influences on the axial parallelism of the rollers during the adjustment process. Precision is further increased if two guide rails, on which the guide carriage is mounted, are provided. In addition, further necessary elements of the device can be arranged on the carriage that can thus form a compact unit untroubled by the positioning movement of the rollers. These elements may be, for example, those necessary for supplying the printing roller with the release agent, such as a transfer roller in roll-off contact with the printing roller with following anilox roll, to which oil is fed from an oil evaporator.

Figure 2:
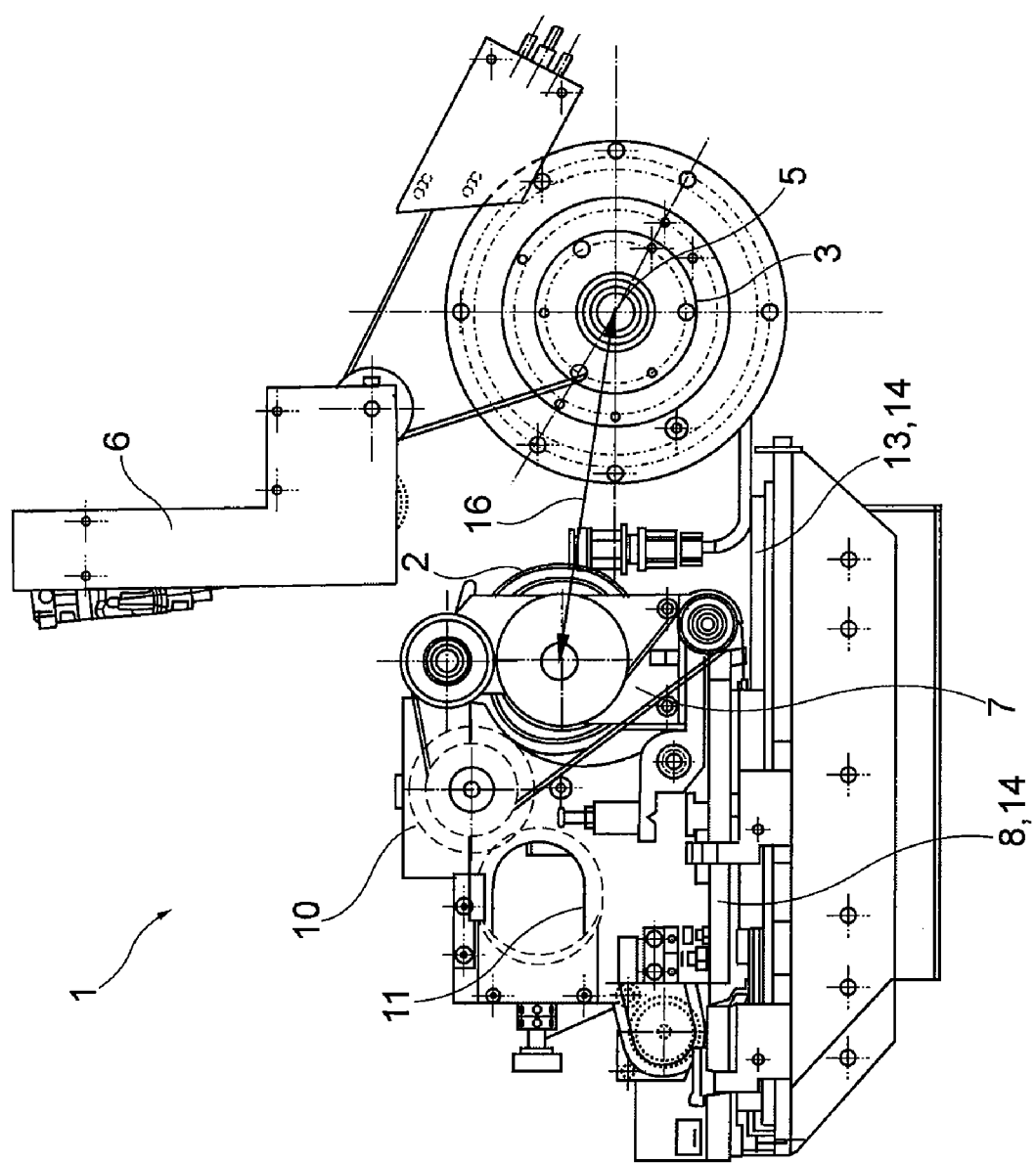
FIG. 2 is a side view of the pattern module in the resting position.
Figure 3:
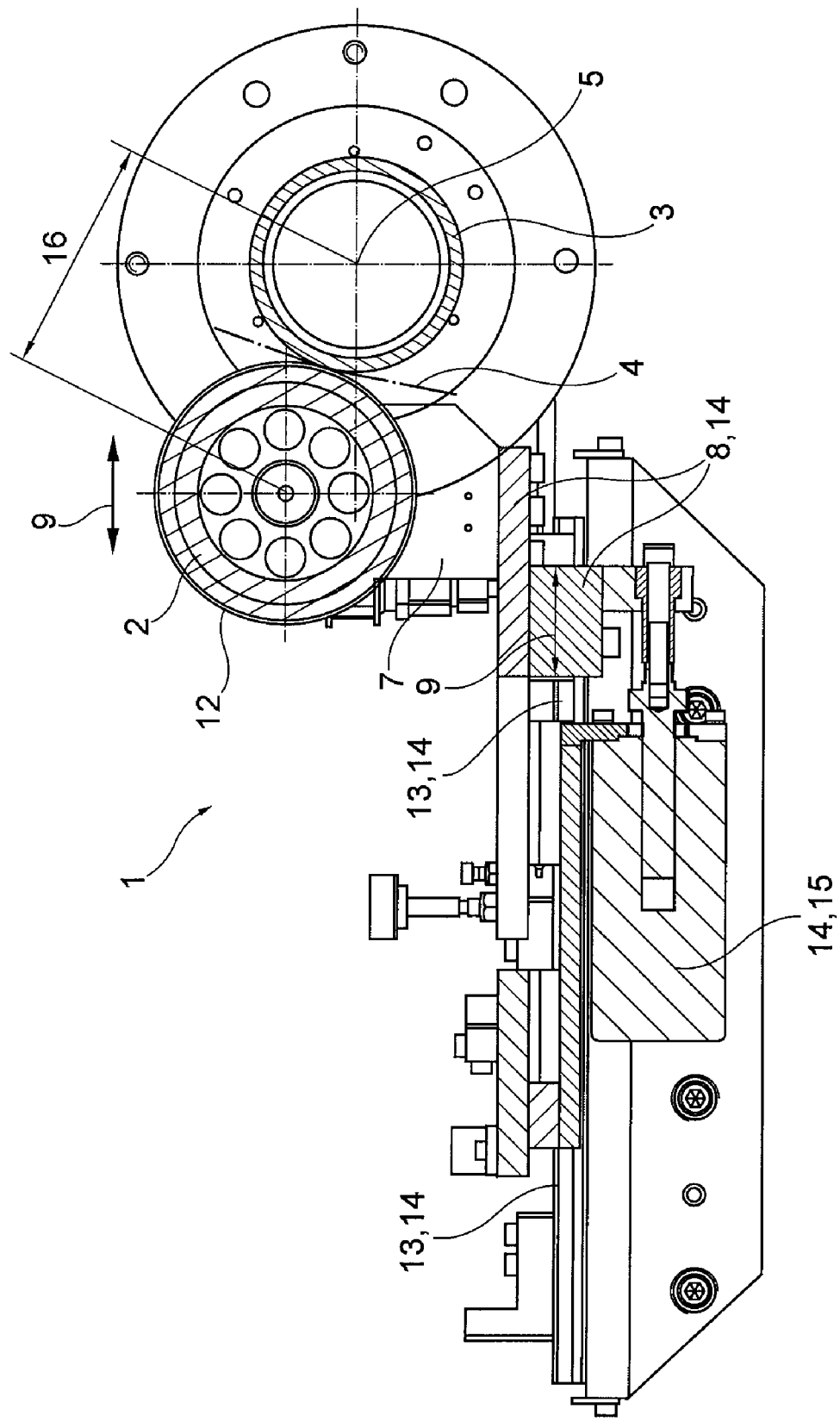
FIG. 3 is a cross-sectional view of a detail of the pattern module in working position.

FIGS. 1 to 3 show an embodiment of the inventive device labeled pattern module 1, which is a component of a coating installation 40 not shown in more detail. The pattern module 1 comprises a printing roller 2 and a backing roller 3 in operative connection with it, between which the strip-like substrate 4, e.g. a plastic film 4 is transported (evident from FIGS. 1 and 3). The backing roller 3 is pivotably mounted about its axis of rotation 5 in a non-visible, fixed bearing and is driven by a gear wheel coupling device 6.

The printing roller 2 is mounted by means of a roller recipient 7 on a movable guide carriage 8, which is linearly displaceable in the traversing direction 9. On the guide carriage 8 are arranged, among other things, also an oil evaporator (hidden), a transfer roller 10 and a anilox roll 11, with the anilox roll 11 being in direct roll-off contact with the transfer roller 10 and this, in turn, in roll-off contact with the printing roller 2 (evident from FIGS. 1 and 2). Oil evaporator, anilox roll 11 and transfer roller 10 supply the printing roller 2 with oil. The printing roller has a sleeve 12, which is wetted with the oil. Thus, in a working position in which the printing and the backing roller 2, 3 are in operative connection with one another, that is, their surfaces roll off each other under inter-positioning of foil 4, an oil pattern is transferable from the printing roller 2 to the substrate 4 (see FIGS. 1 and 3). For the purpose of transferring the oil pattern in the working position, the printing roller 2 is in mesh with the gear wheel coupling device 6.

The guide carriage 8 is mounted on two spaced-apart guide rails 13, with the guide rails 13 aligned such that the printing roller 2 mounted on the guide carriage 8 may be pushed relative to the backing roller 3 while maintaining a position axially parallel to the axis of rotation 5. Guide carriage 8 and guide rails 13 are part of a servo unit 14, which is actuated by a servo motor 15 fixed on each side of the guide rails 13 (see FIG. 3). The servo motors 15 act on the guide carriage 8 and shift this together with the printing roller 2 along the guide rails 13 in traversing direction 9, such that the servo unit 14, under the drive of the servo motors 15, makes possible both connection of the printing roller 2 to the backing roller 3 and, in reverse operation of the servo motors 15, disconnection of the printing roller 2 from the backing roller 3. The servo motors 15 implemented as stepper motors 15 shift the guide carriage 8 in predetermined increments, such that any desired radial distance 16 can be adjusted between the printing roller 2 and the backing roller 3. Thus, by means of this inventive servo unit 14, not only a working position of the pattern module 1 in accordance with FIGS. 1 and 3, in which the printing and backing roller 2, 3 are in operative connection, but also a resting position is positionable, in which the printing and backing roller 2, 3 are spaced apart from each other for a break in production of pattern module 1 (FIG. 2).

The radial distance 16 between the printing roller 2 and the backing roller 3 is adjustable by means of the stepper motors 15 in very small increments, such that, as necessary, the working position of the printing and backing roller 2, 3 in operative connection can be adjusted precisely. By means of remote control of the stepper motors 15 via a central control unit 41 outside the coating installation 40, this adjustment can be effected on the evacuated pattern module 1, even during the coating process.

FIG. 4 is a schematic illustration of servo motor 15 within a vacuum coating installation 40. A control unit 41 controls the servo motor 15 from outside the vacuum coating installation 40.

While the foregoing is directed to embodiments of the invention, other and further embodiments of the invention may be devised without departing from the basic scope thereof, and the scope thereof is determined by the claims that follow.

What is claimed is:

1. An apparatus for coating a substrate, comprising:
    a printing roller and a backing roller, the substrate guided between the printing roller and the backing roller;
    a release agent transferable to the substrate via the printing roller,
    a servo unit that has a controllable servo motor disposed within a vacuum coating installation, wherein in a working position adjustable with the servo unit, the printing roller and the backing roller are in operative connection with one another; and
    a control unit adapted to control the servo motor, wherein the control unit is outside the vacuum coating installation.

2. The apparatus of claim 1, wherein a radial distance can be adjusted between the printing roller and the backing roller by means of the servo motor.

3. The apparatus of claim 1, wherein the servo motor is formed as a stepper motor.

4. The apparatus of claim 1, wherein several servo motors are provided, which are selectively controllable by means of the control unit.

5. The apparatus of claim 1, wherein the printing roller has an exchangeable pattern sleeve.

6. The apparatus of claim 1, wherein the printing roller can be connected to and disconnected from the backing roller by means of the servo unit.

7. The apparatus of claim 6, wherein the servo unit has a guide carriage mounted on a guide rail, the printing roller located on the guide carriage.

8. The apparatus of claim 7, wherein the guide carriage can be traversed by means of the servo motor along the guide rails.

9. The apparatus of claim 8, wherein a radial distance can be adjusted between the printing roller and the backing roller by means of the servo motor.

10. The apparatus of claim 9, wherein the servo motor is formed as a stepper motor.

11. The apparatus of claim 10, wherein several servo motors are provided, which are selectively controllable by means of the control unit.

12. The apparatus of claim 11, wherein the printing roller has an exchangeable pattern sleeve.

\* \* \* \* \*